(12) United States Patent
Yasusaka

(10) Patent No.: US 12,136,921 B2
(45) Date of Patent: Nov. 5, 2024

(54) CLAMP CIRCUIT

(71) Applicant: Rohm Co., Ltd., Kyoto (JP)

(72) Inventor: Makoto Yasusaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/794,028

(22) PCT Filed: Feb. 5, 2021

(86) PCT No.: PCT/JP2021/004310
§ 371 (c)(1),
(2) Date: Jul. 20, 2022

(87) PCT Pub. No.: WO2021/166679
PCT Pub. Date: Aug. 26, 2021

(65) Prior Publication Data
US 2023/0140757 A1  May 4, 2023

(30) Foreign Application Priority Data
Feb. 19, 2020 (JP) .................................. 2020-025829

(51) Int. Cl.
*G05F 3/20* (2006.01)
*G05F 1/56* (2006.01)
*G05F 3/24* (2006.01)
*H03K 5/08* (2006.01)

(52) U.S. Cl.
CPC ............... *H03K 5/084* (2013.01); *G05F 1/56* (2013.01); *G05F 3/247* (2013.01)

(58) Field of Classification Search
CPC .................................. G05F 3/20; G05F 3/247
See application file for complete search history.

(56) References Cited

U.S. PATENT DOCUMENTS

| | | | | |
|---|---|---|---|---|
| 4,441,825 A | * | 4/1984 | Morokawa | G04G 3/022 368/203 |
| 4,663,584 A | * | 5/1987 | Okada | H03H 11/245 323/315 |
| 4,918,336 A | * | 4/1990 | Graham | H03K 19/0952 326/31 |
| 5,097,303 A | * | 3/1992 | Taguchi | G05F 1/465 365/226 |
| 5,150,188 A | * | 9/1992 | Hara | G05F 3/247 327/537 |

(Continued)

FOREIGN PATENT DOCUMENTS

| | | |
|---|---|---|
| JP | 2012023912 | 2/2012 |
| JP | 2013090278 | 5/2013 |

OTHER PUBLICATIONS

International Search Report in International Appln. No. PCT/JP2021/004310, dated Apr. 20, 2021, 5 pages (with English Translation).

*Primary Examiner* — Thomas J. Hiltunen
(74) *Attorney, Agent, or Firm* — Fish & Richardson P.C.

(57) ABSTRACT

A clamp circuit includes a first MOS transistor and a second MOS transistor connected in series with the first MOS transistor. The first MOS transistor has a gate connected to a drain of the first MOS transistor. The second MOS transistor has a gate connected to a drain of the second MOS transistor. The clamp circuit is configured so that at least one of the first MOS transistor and the second MOS transistor causes a body effect.

5 Claims, 9 Drawing Sheets

(56) References Cited

U.S. PATENT DOCUMENTS

| | | | | |
|---|---|---|---|---|
| 5,973,544 A * | 10/1999 | Ohno | ............... | G05F 3/247 |
| | | | | 327/543 |
| 6,194,920 B1 * | 2/2001 | Oguri | ............... | H03F 3/303 |
| | | | | 327/563 |
| 6,271,710 B1 * | 8/2001 | Ooishi | ............... | G05F 3/262 |
| | | | | 327/512 |
| 6,442,079 B2 * | 8/2002 | Lee | ............... | G11C 16/30 |
| | | | | 365/189.09 |
| 7,479,821 B2 * | 1/2009 | Imura | ............... | G05F 3/24 |
| | | | | 327/543 |
| 8,803,621 B2 * | 8/2014 | Suzuki | ............... | H03L 1/00 |
| | | | | 331/109 |
| 8,975,939 B2 * | 3/2015 | Negoro | ............... | H02H 9/04 |
| | | | | 327/321 |
| 9,767,861 B2 * | 9/2017 | Gilliland | ............... | G11C 5/147 |
| 2012/0013383 A1 | 1/2012 | Negoro et al. | | |

\* cited by examiner

CASE OF N-TYPE MOS TRANSISTOR

CASE OF P-TYPE MOS TRANSISTOR

Id : DRAIN VOLTAGE
VGS : GATE-SOURCE VOLTAGE
(= GATE VOLTAGE − SOURCE VOLTAGE)
Vbgs : BACKGATE-SOURCE VOLTAGE
(= BACKGATE VOLTAGE − SOURCE VOLTAGE)

CLAMP CIRCUIT

TECHNICAL FIELD

The invention disclosed in this specification relates to a clamp circuit for clamping voltage.

BACKGROUND ART

FIG. 9 is a diagram illustrating the clamp circuit using a zener diode. The clamp circuit illustrated in FIG. 9 clamps a voltage applied at a connection node between a current source 1 and a zener diode ZD1 to a breakdown voltage Vz of the zener diode ZD1, when an input voltage VIN more than a predetermined voltage is applied to the current source 1.

FIG. 10 is a diagram illustrating the clamp circuit using diodes. The clamp circuit illustrated in FIG. 10 clamps the voltage applied at the connection node between the current source 1 and a diode D1 to a voltage that is m times a forward voltage Vf, when the input voltage VIN more than a predetermined voltage is applied to the current source 1. Note that m is the number of the diodes connected in series.

In the clamp circuit illustrated in FIG. 10, it may be possible to use a bipolar transistor connected as a diode (a bipolar transistor whose collector and base are short-circuited to each other) as each of the diodes D1 to Dm, or to use a MOS transistor connected as a diode (a MOS transistor whose drain and gate are short-circuited to each other) as each of the diodes D1 to Dm.

Note that Patent Document 1 can be given as an example of a conventional technique related to the above description.

LIST OF CITATIONS

Patent Literature

Patent Document 1: JP-A-2012-023912

SUMMARY OF THE INVENTION

Technical Problem

When a zener diode is not prepared as a discrete component but is incorporated in a semiconductor integrated circuit device, the breakdown voltage of the zener diode is usually fixed. Therefore, if the clamp circuit illustrated in FIG. 9 is incorporated in a semiconductor integrated circuit device, the clamp voltage cannot be adjusted usually.

In contrast, in the clamp circuit illustrated in FIG. 10, the clamp voltage can be adjusted by changing the number of the diodes connected in series. However, as the number of the diodes connected in series increases more, clamp voltage variation and temperature characteristics of the clamp voltage are deteriorated more. In addition, as the number of the diodes connected in series increases more, the circuit area increases more as an inconvenience.

Means for Solving the Problem

A clamp circuit disclosed in this specification includes a first MOS transistor and a second MOS transistor connected in series with the first MOS transistor. The first MOS transistor has a gate connected to a drain of the first MOS transistor, the second MOS transistor has a gate connected to a drain of the second MOS transistor, and at least one of the first MOS transistor and the second MOS transistor causes a body effect (first structure).

The clamp circuit of the first structure described above may have a structure in which the first MOS transistor is an N-channel type MOS transistor, the second MOS transistor is a P-channel type MOS transistor, the first MOS transistor has a source connected to a source of the second MOS transistor, and both the first MOS transistor and the second MOS transistor cause the body effect (second Structure).

The clamp circuit of the second structure described above may have a structure in which the first MOS transistor has a backgate connected to the drain of the second MOS transistor, and the second MOS transistor has a backgate connected to the drain of the first MOS transistor (third Structure).

The clamp circuit of the second or third structure described above may have a structure further including a resistor or a diode, in which the source of the first MOS transistor is connected to the source of the second MOS transistor via the resistor or the diode (fourth Structure).

The clamp circuit of the first structure described above may have a structure in which only one of the first MOS transistor and the second MOS transistor causes the body effect (fifth Structure).

The clamp circuit of any one of the first to fifth structures the described above may have a structures further including a third MOS transistor, in which the third MOS transistor is configured so that a first clamp voltage based on a threshold value voltage of the first MOS transistor and a threshold value voltage of the second MOS transistor is applied to a gate of the third MOS transistor, and is configured so as to generate a second clamp voltage based on the first clamp voltage and a threshold value voltage of the third MOS transistor (sixth Structure).

The clamp circuit of the sixth structure described above may have a structure in which the third MOS transistor is a depletion type MOS transistor (seventh Structure).

A semiconductor integrated circuit device disclosed in this specification includes the clamp circuit of any one of the first to seventh structures described above (eighth Structure).

Advantageous Effects of the Invention

According to the clamp circuit disclosed in this specification, an appropriate clamp voltage can be generated.

DESCRIPTION OF EMBODIMENTS

In this specification, a MOS transistor means a transistor whose gate structure consists of at least three layers including a layer made of a conductor or a semiconductor having a small resistance such as polysilicon, an insulation layer, and a P-type, an N-type, or an intrinsic semiconductor layer. In other words, the gate structure of the MOS transistor is not limited to a three-layer structure of metal, oxide, and semiconductor.

First Embodiment

Figure 1:
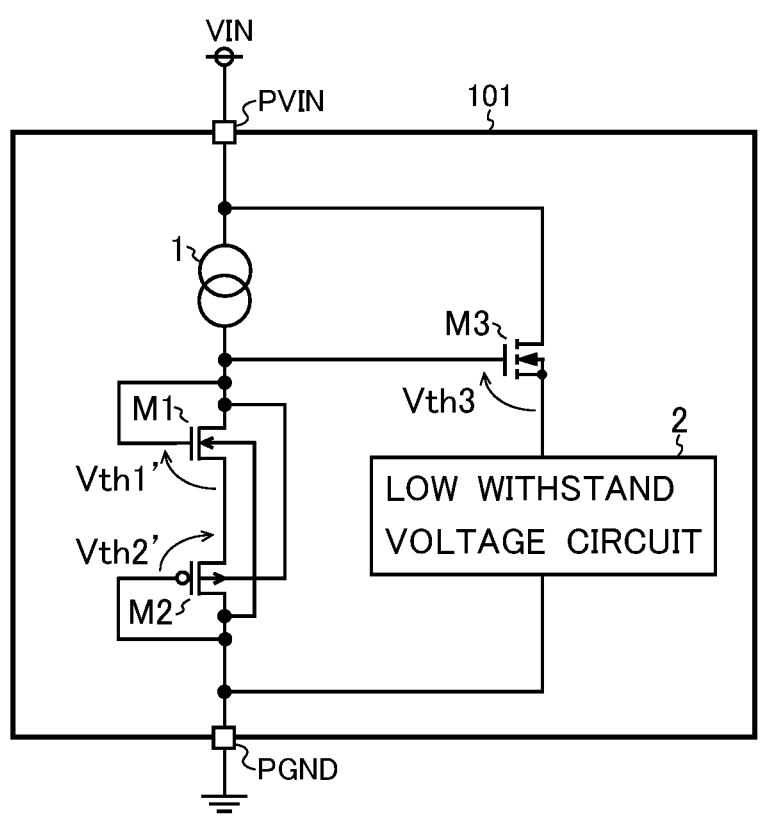
FIG. 1 is a diagram illustrating a schematic structure of a semiconductor integrated circuit device according to a first embodiment.

FIG. 1 is a diagram illustrating a schematic structure of a semiconductor integrated circuit device 101 according to a first embodiment (hereinafter referred to simply as the semiconductor integrated circuit device 101).

The semiconductor integrated circuit device 101 has a terminal PVIN, a terminal PGND, a current source 1, a low withstand voltage circuit 2, and first to third MOS transistors M1 to M3.

The use of the semiconductor integrated circuit device 101 is not limited specifically. For instance, if the semiconductor integrated circuit device 101 is a semiconductor integrated circuit device for a switching power supply device, the semiconductor integrated circuit device 101 and its external components constitute the switching power supply device. Further, for example, if the semiconductor integrated circuit device 101 is an LED driver, the semiconductor integrated circuit device 101 and its external components constitute an LED lighting device.

The terminal PVIN is configured to receive an input voltage VIN.

The terminal PGND is connected to a ground potential lower than the input voltage VIN.

The first MOS transistor M1 is an enhancement type N-channel MOS transistor. The first MOS transistor M1 is a MOS transistor connected as a diode. In other words, as described later, the gate of the first MOS transistor M1 is connected to the drain of the first MOS transistor M1.

The second MOS transistor M2 is an enhancement type P-channel MOS transistor. The second MOS transistor M2 is also a MOS transistor connected as a diode similarly to the first MOS transistor M1. In other words, as described later, the gate of the second MOS transistor M2 is connected to the drain of the second MOS transistor M2.

The third MOS transistor M3 is a depletion type N-channel MOS transistor.

One end of the current source 1 and a drain of the third MOS transistor M3 are connected to the terminal PVIN.

The other end of the current source 1 is connected to the gate and drain of the first MOS transistor M1, a backgate of the second MOS transistor M2, and a gate of the third MOS transistor M3.

A source of the first MOS transistor M1 is connected to a source of the second MOS transistor M2.

The gate and drain of the second MOS transistor M2, and a backgate of the first MOS transistor M1 are connected to the terminal PGND.

The low withstand voltage circuit 2 is disposed between a source of the third MOS transistor M3 and the terminal PGND. The low withstand voltage circuit 2 operates with a power supply voltage that is a potential difference between the source voltage of the third MOS transistor M3 and the ground potential. The low withstand voltage circuit 2 is a circuit that has a withstand voltage lower than an assumed maximum value of the input voltage VIN. Therefore, when the input voltage VIN becomes excessive, the semiconductor integrated circuit device 101 clamps the source voltage of the third MOS transistor M3 so as to prevent the low withstand voltage circuit 2 from breaking down.

When the input voltage VIN more than a predetermined voltage is applied to the terminal PVIN, the current source 1 outputs current to the first MOS transistor M1 and the second MOS transistor M2. In this case, a drain voltage of the first MOS transistor M1 has the value obtained by adding a threshold value voltage Vth2' of the second MOS transistor M2 and a threshold value voltage Vth1' of the first MOS transistor M1 to the ground potential. In other words, when the input voltage VIN more than a predetermined voltage is applied to the terminal PVIN, the drain voltage of the first MOS transistor M1 is clamped to a first clamp voltage (=ground potential+threshold value voltage Vth2'+threshold value voltage Vth1').

Figure 2:
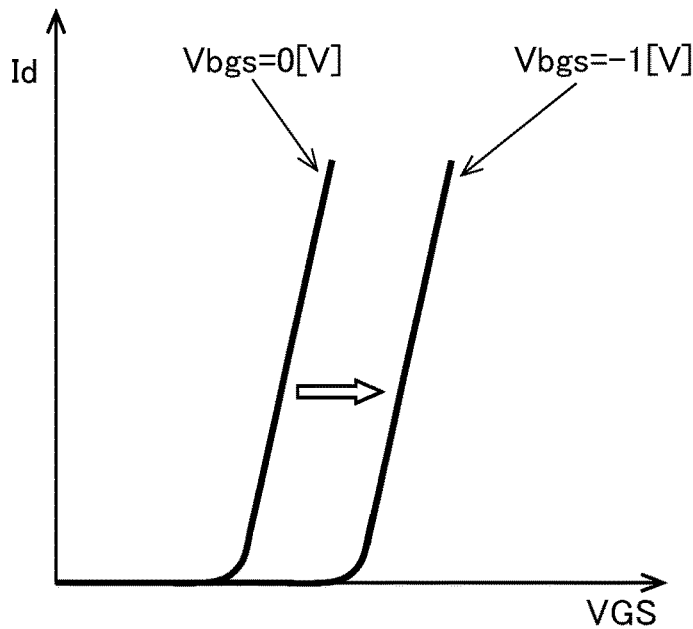
FIG. 2 is a diagram for describing a body effect.
Figure 2:
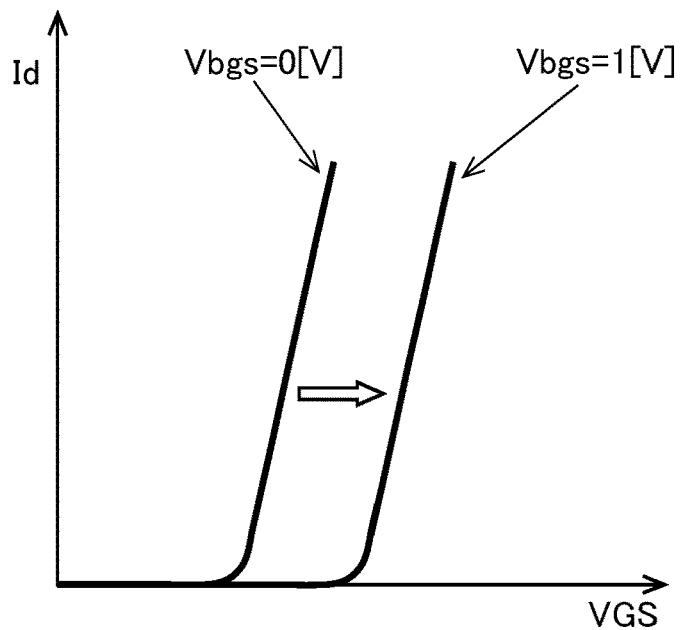

Here, as described above, the backgate of the first MOS transistor M1 is connected to the drain of the second MOS transistor M2, and hence the backgate voltage of the first MOS transistor M1 is less than the source voltage of the first MOS transistor M1. Therefore, the first MOS transistor M1 causes a body effect (see FIG. 2). In other words, the threshold value voltage Vth1' of the first MOS transistor M1 is more than a threshold value voltage Vth1 of the first MOS transistor M1 when the backgate of the first MOS transistor M1 is connected not to the drain of the second MOS transistor M2 but to the source of the first MOS transistor M1.

In addition, as described above, the backgate of the second MOS transistor M2 is connected to the drain of the first MOS transistor M1, the backgate voltage of the second MOS transistor M2 is more than the source voltage of the second MOS transistor M2. Therefore, the second MOS transistor M2 causes the body effect (see FIG. 2). In other words, the threshold value voltage Vth2' of the second MOS transistor M2 is more than a threshold value voltage Vth2 of the second MOS transistor M2 when the backgate of the second MOS transistor M2 is connected not to the drain of the first MOS transistor M1 but to the source of the second MOS transistor M2.

Further, when the threshold value voltage Vth2' becomes more than the threshold value voltage Vth2, influence of the body effect in the first MOS transistor M1 becomes more. When the threshold value voltage Vth1' becomes more than the threshold value voltage Vth1, influence of the body effect in the second MOS transistor M2 becomes more.

As a result, each of the threshold value voltages Vth1 and Vth2 is approximately 0.6 to 1 V (a specific value varies depending on a type or a size of the MOS transistor), while each of the threshold value voltages Vth1' and Vth2' increases to approximately 1 to 1.6 V (a specific value varies depending on a type or a size of the MOS transistor). In this way, the number of elements necessary for generating the first clamp voltage can be reduced.

Figure 10:
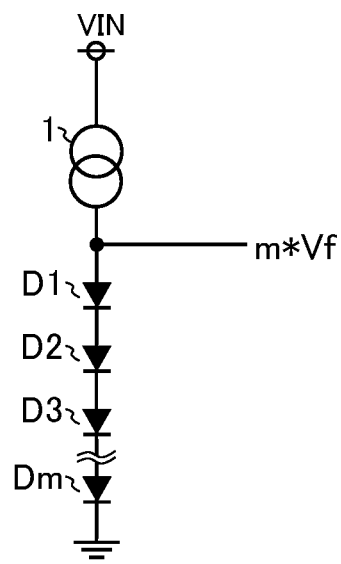
FIG. 10 is a diagram illustrating a clamp circuit using diodes.

For instance, when setting the first clamp voltage to 3 V, two MOS transistors (the first MOS transistor M1 and the second MOS transistor M2) are connected in series in the semiconductor integrated circuit device 101. In contrast, when setting the clamp voltage to 3 V in the clamp circuit illustrated in FIG. 10, five diodes are required to be connected in series.

Further as an example, it is supposed that the threshold value voltages of the MOS transistors and the forward voltage of the diode each have a variation of ±0.15 V and temperature characteristics of −2 mV per degrees Celsius. Then, in the clamp circuit illustrated in FIG. 10, the clamp voltage variation and the temperature characteristics of the clamp voltage are ±0.75 V and −10 mV per degrees Celsius, respectively. In contrast, in the semiconductor integrated circuit device 101, the clamp voltage variation and the temperature characteristics of the first clamp voltage can be decreased to ±0.3 V and −4 mV per degrees Celsius, respectively.

If the input voltage VIN more than a predetermined voltage is applied to the terminal PVIN, the source voltage of the third MOS transistor M3 is clamped to the second clamp voltage. The second clamp voltage described above has the value obtained by subtracting a threshold value voltage Vth3 of the third MOS transistor M3 from the first clamp voltage (=ground potential+threshold value voltage Vth2' +threshold value voltage Vth1'). Therefore, supposing that the temperature characteristics of the threshold value voltage of the MOS transistor is −2 mV per degrees Celsius, the temperature characteristics of the second clamp voltage can be reduced to −2 mV per degrees Celsius.

In the semiconductor integrated circuit device 101, the third MOS transistor M3 is a depletion type N-channel MOS transistor. Therefore, even if the input voltage VIN is so low that the current source 1 does not work, the power supply voltage can be supplied to the low withstand voltage circuit 2 by turning on the third MOS transistor M3.

Note that unlike this embodiment, the third MOS transistor M3 may be an enhancement type N-channel type MOS transistor or an NPN type bipolar transistor. Further, unlike this embodiment, when clamping to the power supply side, the third MOS transistor M3 may be a P-channel type MOS transistor or a PNP type bipolar transistor.

In addition, the semiconductor integrated circuit device 101 includes the first clamp circuit for generating the first clamp voltage (the clamp circuit having the first and second MOS transistors M1 and M2), and includes the second clamp circuit for generating the second clamp voltage (the clamp circuit having the first to third MOS transistors M1 to M3), but the first clamp circuit may be used alone. In other words, unlike this embodiment, the semiconductor integrated circuit device may have a structure that includes the first clamp circuit but does not include the third MOS transistor M3.

Second Embodiment

Figure 3:
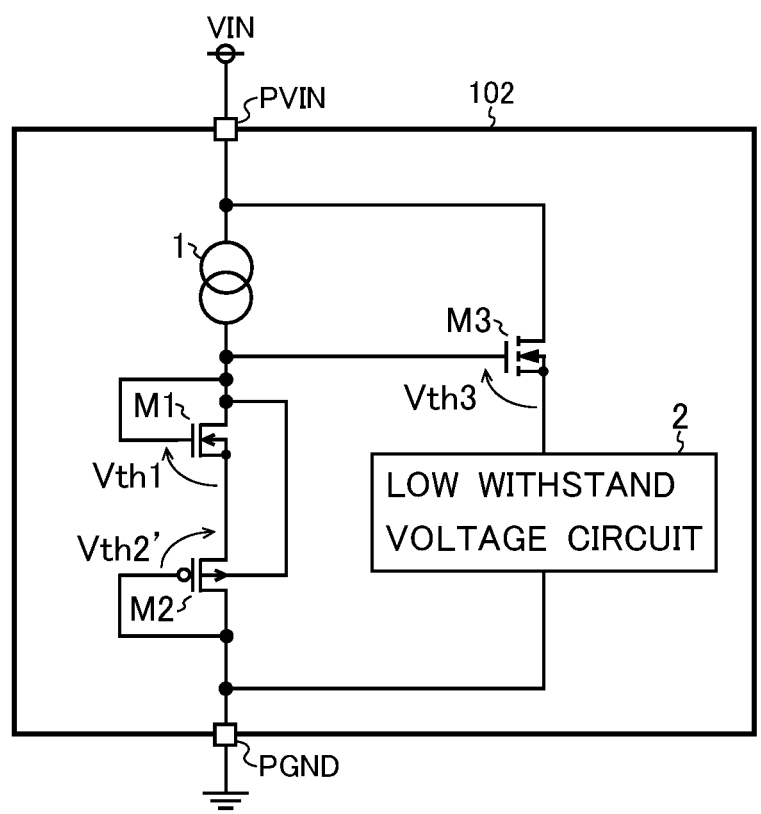
FIG. 3 is a diagram illustrating a schematic structure of the semiconductor integrated circuit device according to a second embodiment.

FIG. 3 is a diagram illustrating a schematic structure of a semiconductor integrated circuit device 102 according to a second embodiment (hereinafter referred to simply as the semiconductor integrated circuit device 102).

The semiconductor integrated circuit device 102 is different from the semiconductor integrated circuit device 101 in the point that the backgate of the first MOS transistor M1 is connected to the source of the first MOS transistor M1, and in other points it has the same structure as the semiconductor integrated circuit device 101.

In the semiconductor integrated circuit device 102, the second MOS transistor M2 causes the body effect, but the first MOS transistor M1 does not cause the body effect. In this way, in the semiconductor integrated circuit device 102, the first clamp voltage and the second clamp voltage can be reduced to less than those in the semiconductor integrated circuit device 101. In other words, when setting the clamp voltage to a lowish value, it is sufficient to use not the semiconductor integrated circuit device 101 but the semiconductor integrated circuit device 102, for example.

Third Embodiment

Figure 4:
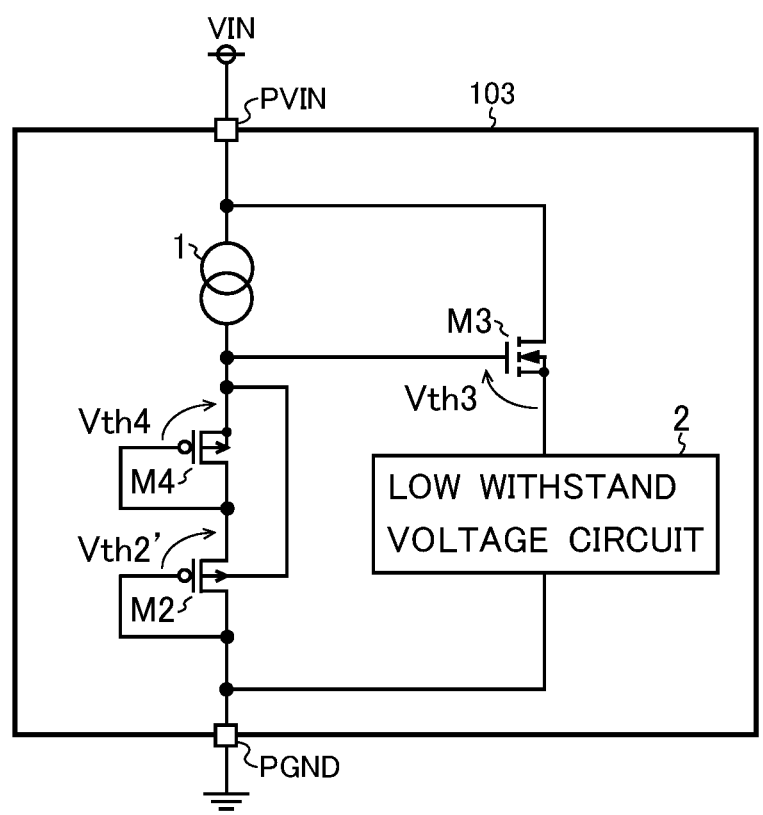
FIG. 4 is a diagram illustrating a schematic structure of the semiconductor integrated circuit device according to a third embodiment.

FIG. 4 is a diagram illustrating a schematic structure of a semiconductor integrated circuit device 103 according to a third embodiment (hereinafter referred to simply as the semiconductor integrated circuit device 103).

The semiconductor integrated circuit device 103 is different from the semiconductor integrated circuit device 102 in the point that it includes a fourth MOS transistor M4 instead of the first MOS transistor M1, and in other points it has the same structure as the semiconductor integrated circuit device 102.

The fourth MOS transistor M4 is an enhancement type P-channel MOS transistor. The source and backgate of the fourth MOS transistor M4 are connected to the other end of the current source 1, the gate of the third MOS transistor M3, and the backgate of the second MOS transistor M2. The gate and drain of the fourth MOS transistor M4 are connected to the source of the second MOS transistor M2. Note that the fourth MOS transistor M4 corresponds to the first MOS transistor recited in the claims.

In the semiconductor integrated circuit device 103, the second MOS transistor M2 causes the body effect, but the fourth MOS transistor M4 does not cause the body effect. In this way, in the semiconductor integrated circuit device 103, the first clamp voltage and the second clamp voltage can be reduced to less than those in the semiconductor integrated circuit device 101. In other words, when setting the clamp voltage to a lowish value, it is sufficient to use not the semiconductor integrated circuit device 101 but the semiconductor integrated circuit device 103, for example.

Fourth Embodiment

Figure 5:
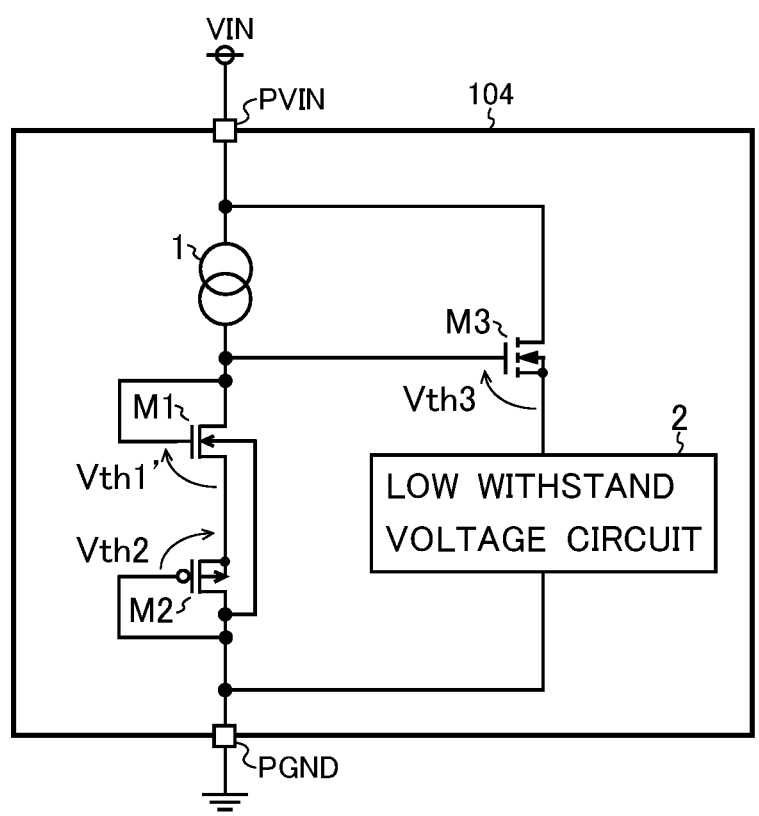
FIG. 5 is a diagram illustrating a schematic structure of the semiconductor integrated circuit device according to a fourth embodiment.

FIG. 5 is a diagram illustrating a schematic structure of a semiconductor integrated circuit device 104 according to a fourth embodiment (hereinafter referred to simply as the semiconductor integrated circuit device 104).

The semiconductor integrated circuit device 104 is different from the semiconductor integrated circuit device 101 in the point that the backgate of the second MOS transistor M2 is connected to the source of the second MOS transistor M2, and in other points it has the same structure as the semiconductor integrated circuit device 101.

In the semiconductor integrated circuit device 104, the first MOS transistor M1 causes the body effect, but the second MOS transistor M2 does not cause the body effect. In this way, in the semiconductor integrated circuit device 104, the first clamp voltage and the second clamp voltage can be reduced to less than those in the semiconductor integrated circuit device 101. In other words, when setting the clamp voltage to a lowish value, it is sufficient to use not the semiconductor integrated circuit device 101 but the semiconductor integrated circuit device 104, for example.

Fifth Embodiment

Figure 6:
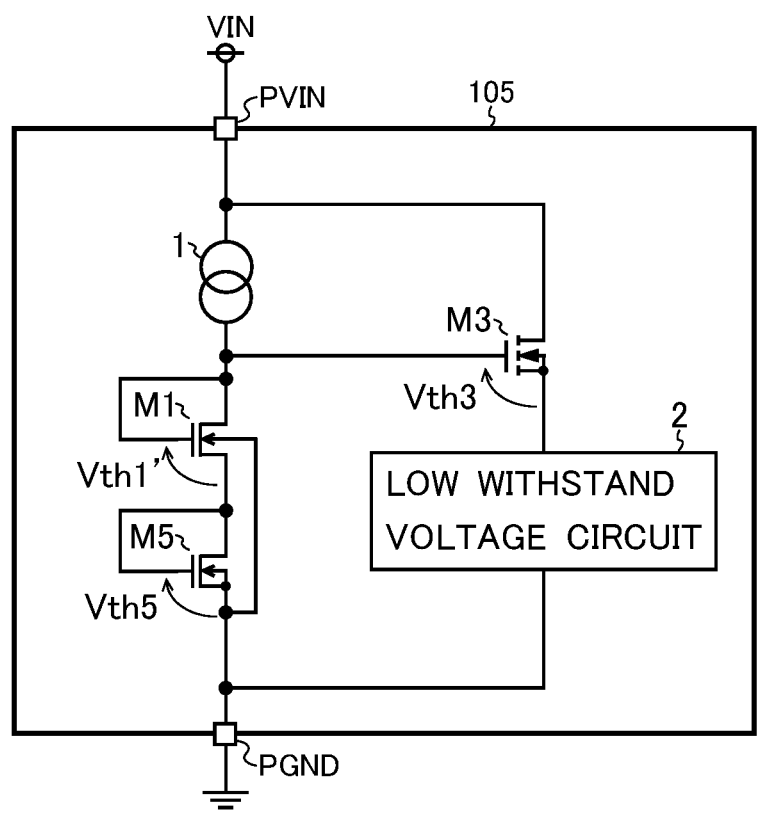
FIG. 6 is a diagram illustrating a schematic structure of the semiconductor integrated circuit device according to a fifth embodiment.

FIG. 6 is a diagram illustrating a schematic structure of a semiconductor integrated circuit device 105 according to a fifth embodiment (hereinafter referred to simply as the semiconductor integrated circuit device 105).

The semiconductor integrated circuit device 105 is different from the semiconductor integrated circuit device 104 in the point that it includes a fifth MOS transistor M5 instead of the second MOS transistor M2, and in other points it has the same structure as semiconductor integrated circuit device 104.

The fifth MOS transistor M5 is an enhancement type N-channel MOS transistor. The source and backgate of the fifth MOS transistor M5 are connected to the terminal PGND, the backgate of the first MOS transistor M1, and the low withstand voltage circuit 2. The gate and drain of the fifth MOS transistor M5 are connected to the source of the first MOS transistor M1. Note that the fifth MOS transistor M5 corresponds to the second MOS transistor recited in the claims.

In the semiconductor integrated circuit device 105, the first MOS transistor M1 causes body effect, but the fifth MOS transistor M5 does not cause the body effect. In this way, in the semiconductor integrated circuit device 105, the first clamp voltage and the second clamp voltage can be reduced to less than those in the semiconductor integrated circuit device 101. In other words, when setting the clamp voltage to a lowish value, it is sufficient to use not the semiconductor integrated circuit device 101 but the semiconductor integrated circuit device 105, for example.

Sixth Embodiment

Figure 7:
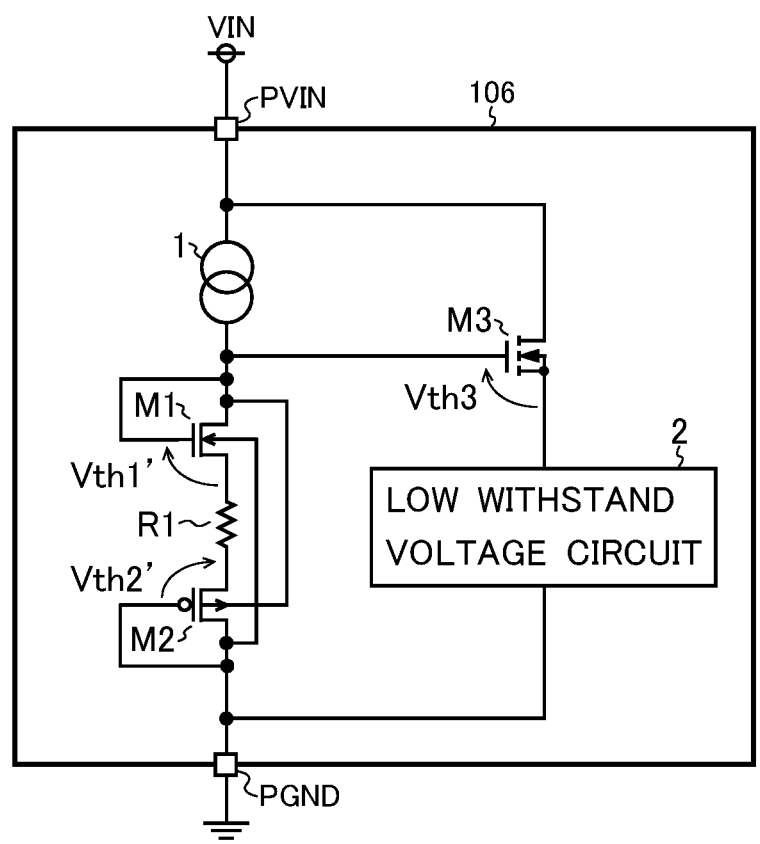
FIG. 7 is a diagram illustrating a schematic structure of the semiconductor integrated circuit device according to a sixth embodiment.

FIG. 7 is a diagram illustrating a schematic structure of a semiconductor integrated circuit device 106 according to a sixth embodiment (hereinafter referred to simply as the semiconductor integrated circuit device 106).

The semiconductor integrated circuit device 106 is different from the semiconductor integrated circuit device 101 in the points that it includes a resistor R1, and that the source of the first MOS transistor M1 is connected to the source of the second MOS transistor M2 via the resistor R1, and in other points it has the same structure as the semiconductor integrated circuit device 101. Note that in order to suppress fluctuation of the clamp voltage, it is desired in this embodiment to use a constant current source as the current source 1.

In this embodiment, the potential difference between both ends of the resistor R1 causes more influence of the body effect in each of the first MOS transistor M1 and the second MOS transistor M2 than that in the first embodiment. In this way, in the semiconductor integrated circuit device 106, the first clamp voltage and the second clamp voltage can be increased to more than those in the semiconductor integrated circuit device 101. In other words, for setting the clamp voltage to a highish value, it is sufficient to use not the semiconductor integrated circuit device 101 but the semiconductor integrated circuit device 106, for example.

Note that unlike this embodiment, a diode (such as a bipolar transistor connected as a diode or a MOS transistor connected as a diode) may be used instead of the resistor R1. However, the resistor R1 has positive temperature characteristics, and hence the temperature characteristics of the first clamp voltage and the second clamp voltage (V per degrees Celsius) can be reduced by disposing not the diode but the resistor R1 between the source of the first MOS transistor M1 and the source of the second MOS transistor M2.

Seventh Embodiment

Figure 8:
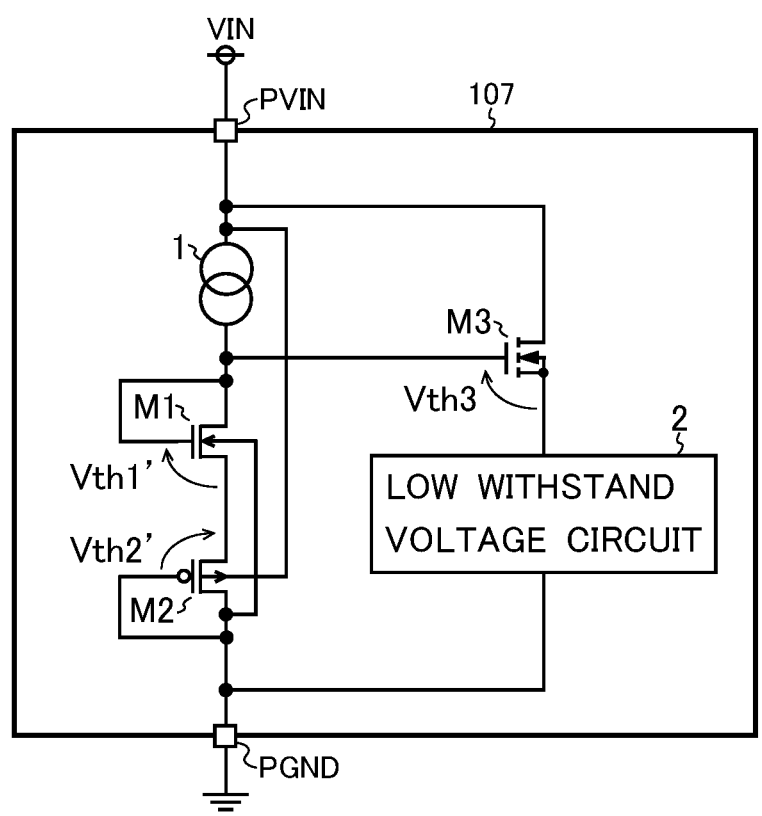
FIG. 8 is a diagram illustrating a schematic structure of the semiconductor integrated circuit device according to a seventh embodiment.
Figure 9:
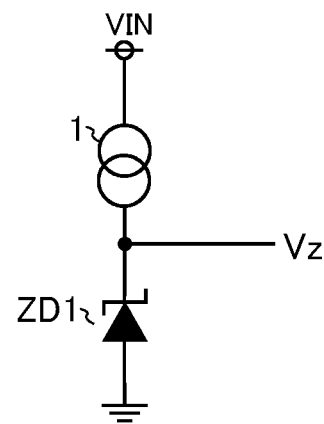
FIG. 9 is a diagram illustrating a clamp circuit using a zener diode.

FIG. 8 is a diagram illustrating a schematic structure of a semiconductor integrated circuit device 107 according to a seventh embodiment (hereinafter referred to simply as the semiconductor integrated circuit device 107).

The semiconductor integrated circuit device 107 is different from the semiconductor integrated circuit device 101 in the point that the backgate of the second MOS transistor M2 is connected to the terminal PVIN, and in other points it has the same structure as the semiconductor integrated circuit device 101.

In this embodiment, the backgate voltage of the second MOS transistor M2 becomes higher than the drain voltage of the first MOS transistor M1, and hence influence of the body effect in the second MOS transistor M2 becomes more than that in the first embodiment. In this way, in the semiconductor integrated circuit device 107, the first clamp voltage and the second clamp voltage can be increased to more than those in the semiconductor integrated circuit device 101. In other words, when setting the clamp voltage to a highish value, it is sufficient to use not the semiconductor integrated circuit device 101 but the semiconductor integrated circuit device 107, for example.

In this embodiment, if the input voltage VIN fluctuate, influence degree of the body effect in the second MOS transistor M2 fluctuates so that the threshold value voltage Vth2' of the second MOS transistor M2 fluctuate. In this way, if the input voltage VIN fluctuates, the first clamp voltage and the second clamp voltage also fluctuate. Therefore, if stability of the first clamp voltage and the second clamp voltage should be regarded important, it is sufficient to adopt the semiconductor integrated circuit device 101 to 105 or the semiconductor integrated circuit device 106 that uses the constant current source as the current source 1, for example.

<Others>

Note that the structure of the present invention can be variously modified, besides the embodiments described above, without deviating from the spirit of the invention.

For instance, a variation described in one embodiment can also be applied to other embodiments, as long as the circuit works without a problem.

In addition, similarly to the seventh embodiment, for example, it may be possible to connect the backgate of the second MOS transistor M2 not to the drain of the first MOS transistor M1 but to the terminal PVIN, in the second embodiment, the third embodiment, or the sixth embodiment.

In addition, without limiting to the terminal PVIN, a predetermined point in the semiconductor integrated circuit device may be connected to the backgate of the first MOS transistor M1, so that the first MOS transistor M1 can cause the body effect. Similarly, a predetermined point in the semiconductor integrated circuit device may be connected to the backgate of the second MOS transistor M2, so that the second MOS transistor M2 can cause the body effect.

In this way, the embodiments described above are merely examples in every aspect and should not be interpreted as limitations. The technical scope of the present invention should be defined not by the above description of the embodiments but by the claims, and should be understood to include all modifications within meaning and scope equivalent to the claims.

LIST OF REFERENCE SIGNS 1 current source
2 low withstand voltage circuit
M1 to M3 first to third MOS transistor
PVIN, PGND terminal

The invention claimed is:

1. A clamp circuit comprising:
   a first MOS transistor;
   a second MOS transistor connected in series with the first MOS transistor without another transistor connected in series between the first MOS transistor and the second MOS transistor; and
   a current source connected between a terminal configured to receive an input voltage and the first MOS transistor, wherein
   the first MOS transistor has a gate connected to a drain of the first MOS transistor,
   the second MOS transistor has a gate connected to a drain of the second MOS transistor,
   the first MOS transistor is an N-channel type MOS transistor,
   the second MOS transistor is a P-channel type MOS transistor,
   the first MOS transistor has a source connected to a source of the second MOS transistor,
   the first MOS transistor has a backgate connected to the drain of the second MOS transistor,
   the second MOS transistor has a backgate connected to a connection node between the drain of the first MOS transistor and the current source without passing through either the current source or a source to drain conduction path of the first MOS transistor,
   both the first MOS transistor and the second MOS transistor cause a body effect,
   the gate of the first MOS transistor and the drain of the first MOS transistor are connected together without another transistor connected between the gate of the first MOS transistor and the drain of the first MOS transistor.

2. The clamp circuit according to claim 1, further comprising a resistor or
   a diode, wherein the source of the first MOS transistor is connected to the source of
   the second MOS transistor via the resistor or the diode.

3. The clamp circuit according to claim 1, further comprising a third MOS transistor, wherein
   the third MOS transistor is configured so that a first clamp voltage based on a threshold value voltage of the first MOS transistor and a threshold value voltage of the second MOS transistor is applied to a gate of the third MOS transistor, and is configured so as to generate a second clamp voltage based on the first clamp voltage and a threshold value voltage of the third MOS transistor.

4. The clamp circuit according to claim 3, wherein the third MOS transistor is a depletion type MOS transistor.

5. A semiconductor integrated circuit device comprising the clamp circuit according to claim 1.

* * * * *